(12) United States Patent
Nguyen

(10) Patent No.: US 8,169,088 B2
(45) Date of Patent: May 1, 2012

(54) POWER CONVERTER INTEGRATED CIRCUIT FLOOR PLAN AND PACKAGE

(75) Inventor: James H. Nguyen, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 445 days.

(21) Appl. No.: 12/497,134

(22) Filed: Jul. 2, 2009

(65) Prior Publication Data

US 2011/0001171 A1    Jan. 6, 2011

(51) Int. Cl.
    *H01L 23/49* (2006.01)
(52) U.S. Cl. ......... 257/786; 257/E23.079; 257/E23.037; 257/E23.07
(58) Field of Classification Search .............. 257/786, 257/E23.07, E23.037, E23.079
    See application file for complete search history.

(56) References Cited

U.S. PATENT DOCUMENTS

| | | | | |
|---|---|---|---|---|
| 6,460,168 B1* | 10/2002 | Yamamoto et al. | ........... | 323/234 |
| 6,465,898 B1* | 10/2002 | Hnilo et al. | ........... | 257/797 |
| 6,709,900 B2* | 3/2004 | Efland et al. | ........... | 438/140 |
| 6,770,935 B2* | 8/2004 | Efland et al. | ........... | 257/337 |
| 6,784,493 B2* | 8/2004 | Efland et al. | ........... | 257/347 |
| 6,940,724 B2* | 9/2005 | Divakar et al. | ........... | 361/719 |
| 7,109,577 B2* | 9/2006 | Shiraishi et al. | ........... | 257/690 |
| 7,138,698 B2* | 11/2006 | Nakamura et al. | ........... | 257/491 |
| 7,295,453 B2* | 11/2007 | Shiraishi et al. | ........... | 363/144 |
| 7,436,070 B2* | 10/2008 | Uno et al. | ........... | 257/777 |
| 7,495,296 B2* | 2/2009 | Maeda et al. | ........... | 257/401 |
| 7,566,931 B2* | 7/2009 | Kocon | ........... | 257/328 |
| 7,618,896 B2* | 11/2009 | Joshi et al. | ........... | 438/728 |
| 7,687,885 B2* | 3/2010 | Hashimoto et al. | ........... | 257/532 |
| 7,687,902 B2* | 3/2010 | Shiraishi et al. | ........... | 257/723 |
| 7,882,482 B2* | 2/2011 | Ueunten | ........... | 716/100 |
| 7,906,375 B2* | 3/2011 | Liu et al. | ........... | 438/121 |
| 7,923,300 B2* | 4/2011 | Bell et al. | ........... | 438/123 |
| 7,968,939 B2* | 6/2011 | Matsuura et al. | ........... | 257/330 |
| 7,989,964 B2* | 8/2011 | Matsunaga et al. | ........... | 257/786 |
| 2005/0179472 A1* | 8/2005 | Nakamura et al. | ........... | 327/109 |
| 2009/0006432 A1* | 1/2009 | Bossong-Iselborn | ........... | 707/100 |
| 2009/0057869 A1* | 3/2009 | Hebert et al. | ........... | 257/691 |
| 2009/0096435 A1* | 4/2009 | Ueunten | ........... | 323/282 |
| 2009/0179235 A1* | 7/2009 | Shiraishi et al. | ........... | 257/288 |
| 2009/0184352 A1* | 7/2009 | Yamaguchi et al. | ........... | 257/296 |
| 2009/0189266 A1* | 7/2009 | Liu et al. | ........... | 257/686 |
| 2009/0273099 A1* | 11/2009 | Matsunaga et al. | ........... | 257/786 |
| 2010/0059795 A1* | 3/2010 | Azrai | ........... | 257/207 |
| 2010/0090668 A1* | 4/2010 | Girdhar et al. | ........... | 323/282 |
| 2010/0155915 A1* | 6/2010 | Bell et al. | ........... | 257/676 |
| 2010/0176430 A1* | 7/2010 | Hashimoto et al. | ........... | 257/296 |

OTHER PUBLICATIONS

Monolithic Power Systems, Package Outline Drawing SOIC8E (Exposed Pad), Jan. 2005, Rev 0.0, 1 page.*

* cited by examiner

*Primary Examiner* — Evan Pert
(74) *Attorney, Agent, or Firm* — Perkins Coie LLP

(57) ABSTRACT

For a DC to DC converter circuit integrated on a packaged die, the relative positions of various die pads and power MOSFETs on the die for a small outline integrated circuit package are described.

14 Claims, 4 Drawing Sheets

POWER CONVERTER INTEGRATED CIRCUIT FLOOR PLAN AND PACKAGE

FIELD

The present invention relates to integrated circuits and packaging.

BACKGROUND

Many DC to DC converters may be conceptualized by the circuit illustrated in FIG. 1, where electrical power from a source having a supply voltage $V_{IN}$ is provided to load 102 such that the load voltage is regulated to some voltage less than $V_{IN}$. A feedback path is provided from node 103 to controller 104, where controller 104 controls the duty cycle of high-side switch 106 and low-side switch 108 to regulate the load voltage. A second-order low pass filter comprising inductor 110 and capacitor 112 couples load 102 to switch point 114 so as to smooth output ripples.

The operating principles for the circuit of FIG. 1 are well known to those skilled in the art of power converters, and need not be repeated here. However, the circuit of FIG. 1 serves as a focal point for discussing some of the issues facing circuit designers. One such issue is the resistance of switches 106 and 108 when they are switched on, which may be termed an on-resistance. In particular, modern microprocessors and other low-power circuits require relatively low regulated supply voltages, so that the duty cycle for low-side switch 108 is larger than the duty cycle for switch 106. As a result, with lower and lower load voltages, the on-resistance of switch 108 may be critical if wasted power is to be minimized. The resistance of the bond wires to switches 106 and 108 also should to be factored in with their on-resistances when considering the power loss due to heat dissipation.

In practice, switches 106 and 108 are realized as power MOSFETs (Metal-Oxide-Semiconductor-Field-Effect-Transistor), where each MOSFET comprises a large number of MOSFETs in parallel. As is well known, there may result parasitic NPN transistors for the power MOSFETs, leading to unwanted current flow. This is illustrated in FIG. 2, where MOSFETs 202 and 204 are the high-side and low-side switches, respectively, and the parasitic NPN transistor for MOSFET 204 is illustrated as transistor 206. For ease of illustration, the feedback path and controller are not shown in FIG. 2, but drivers for MOSFETs 202 and 204 are abstracted by logic gates 208 and 210 to illustrate so-called break-before-make logic. With break-before-make logic, a control signal at input port 212 switches MOSFETS 202 and 204 on and off so that both cannot be on at the same time.

During the dead-time when both MOSFETs 202 and 204 are off simultaneously, and when the current through inductor 110 is in a direction towards load 102 as indicated by arrow 214, the voltage at switch point 114 may fall below ground to $-V_{BE}$, where $V_{BE}$ is the turn-on voltage for NPN transistor 206, causing emitter current to flow through transistor 206. This causes an unwanted parasitic substrate injection current, which may affect the performance of other circuits in controller 104. For example, in band-gap circuits used to provide a reference voltage, as well as in other circuits, often spatially separated circuit components need to be matched for good performance. However, injection current may not be uniform among such components, so that they do not exhibit matched performance. This may seriously degrade the overall performance of the DC to DC power converter.

To mitigate the flow of substrate injection current into sensitive circuit components, structures may be formed around the power MOSFETs to collect and return to ground substrate injection current so that very little substrate injection current finds its way to sensitive circuits. These structures are commonly referred to as moats.

Another design issue is that the resistance of the wires from the integrated circuit to the package leads should to be considered when designing for high performance. The length of the wires depends upon the placement and size of various components of the DC to DC power converter circuit, as well as the package type. The cost of silicon has dropped to the point where often a substantial cost of the final product is the package rather than the silicon. Consequently, often a circuit designer must design the circuit for a specific package. This represents a formidable challenge when designing a high performance circuit because the circuit designer is not free to choose the number or relative positions of the package leads. For a specific package, there is no obvious way to optimize the size and placement of the power MOSFETs, moats, and switch points so that the sum of the on-resistance and wire resistance for one or both power MOSFETS is minimized, or near minimum.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

These letters patent teach a floor plan for a DC to DC power converter integrated circuit for a specific family of packages, where the floor plan teaches the placement of the power MOSFETs, moats, and switching points. It is believed that the particular floor plan described here is at least near optimum for the specific package under consideration, while leaving sufficient die space for circuit components that control the duty cycles of the power MOSFETs. The arrangement of the other circuit components in the auxiliary circuits, such as for example a band-gap circuit or the controller, need not be specified in detail because they do not appreciably affect the wire resistance and MOSFET on-resistance.

Figure 1:
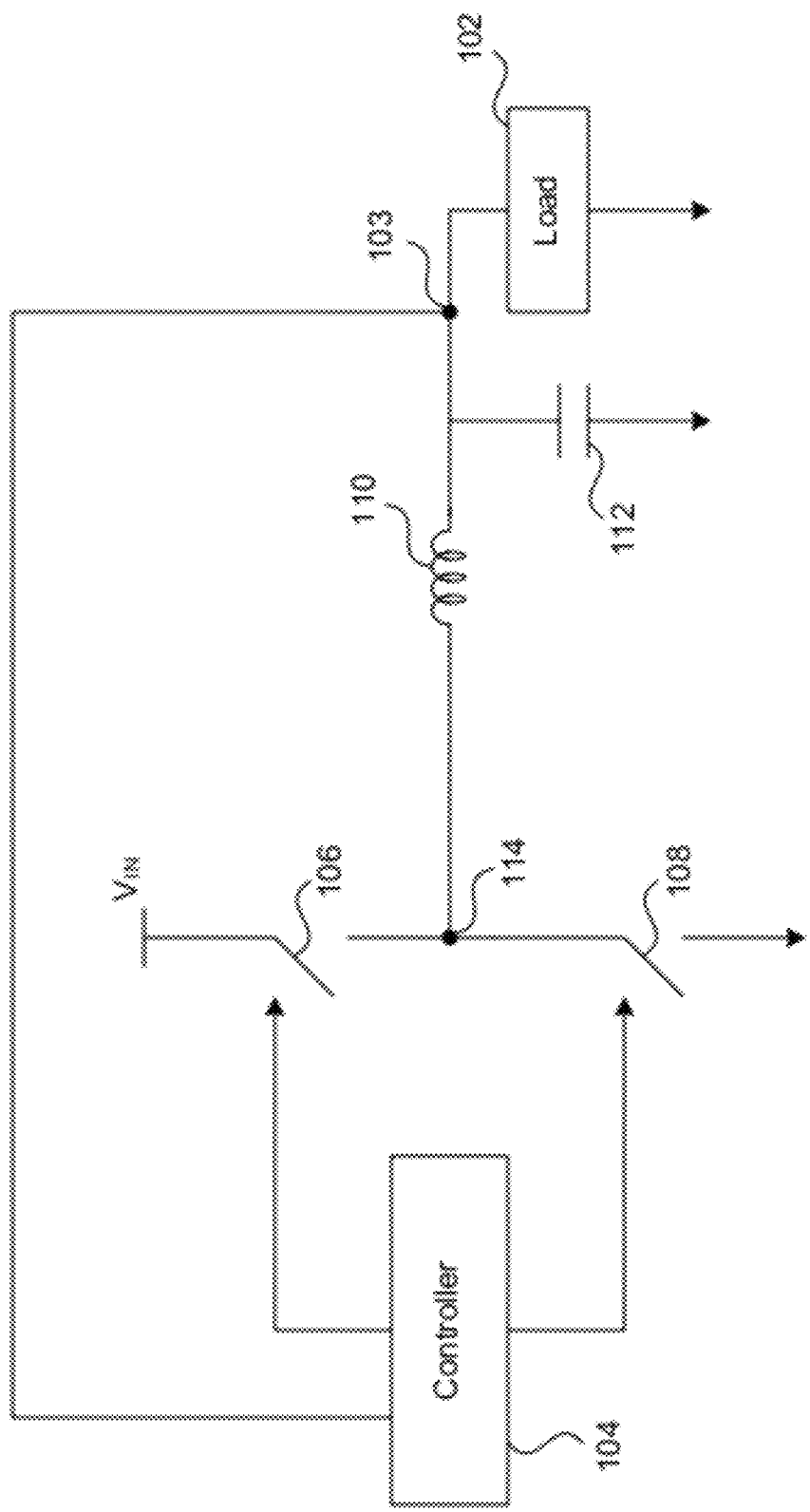
FIG. 1 is a high level illustration of a prior art DC to DC power converter.
Figure 2:
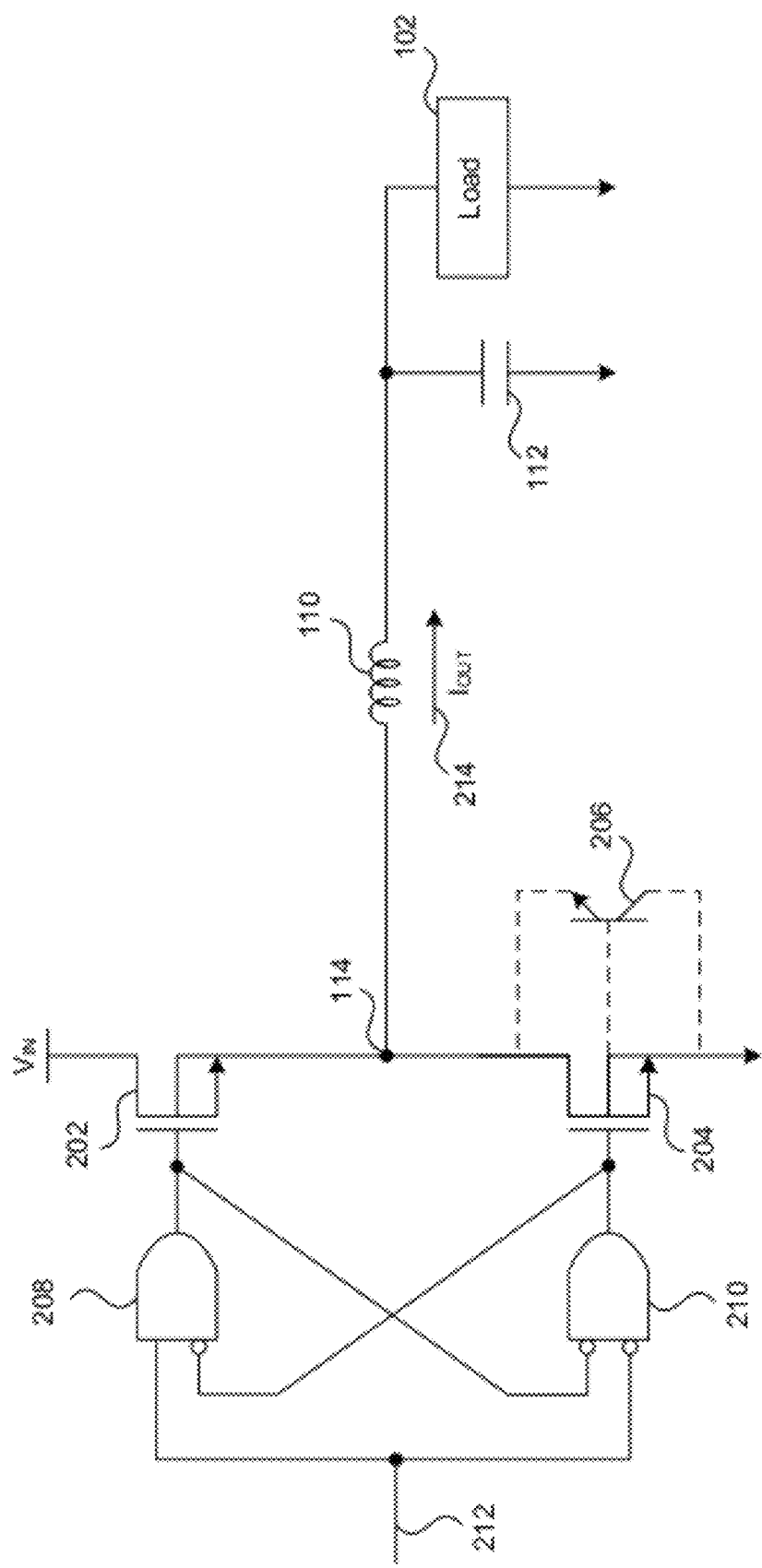
FIG. 2 is a high level illustration of a prior art DC to DC power converter showing a parasitic NPN transistor for the low-side switch.
Figure 3:
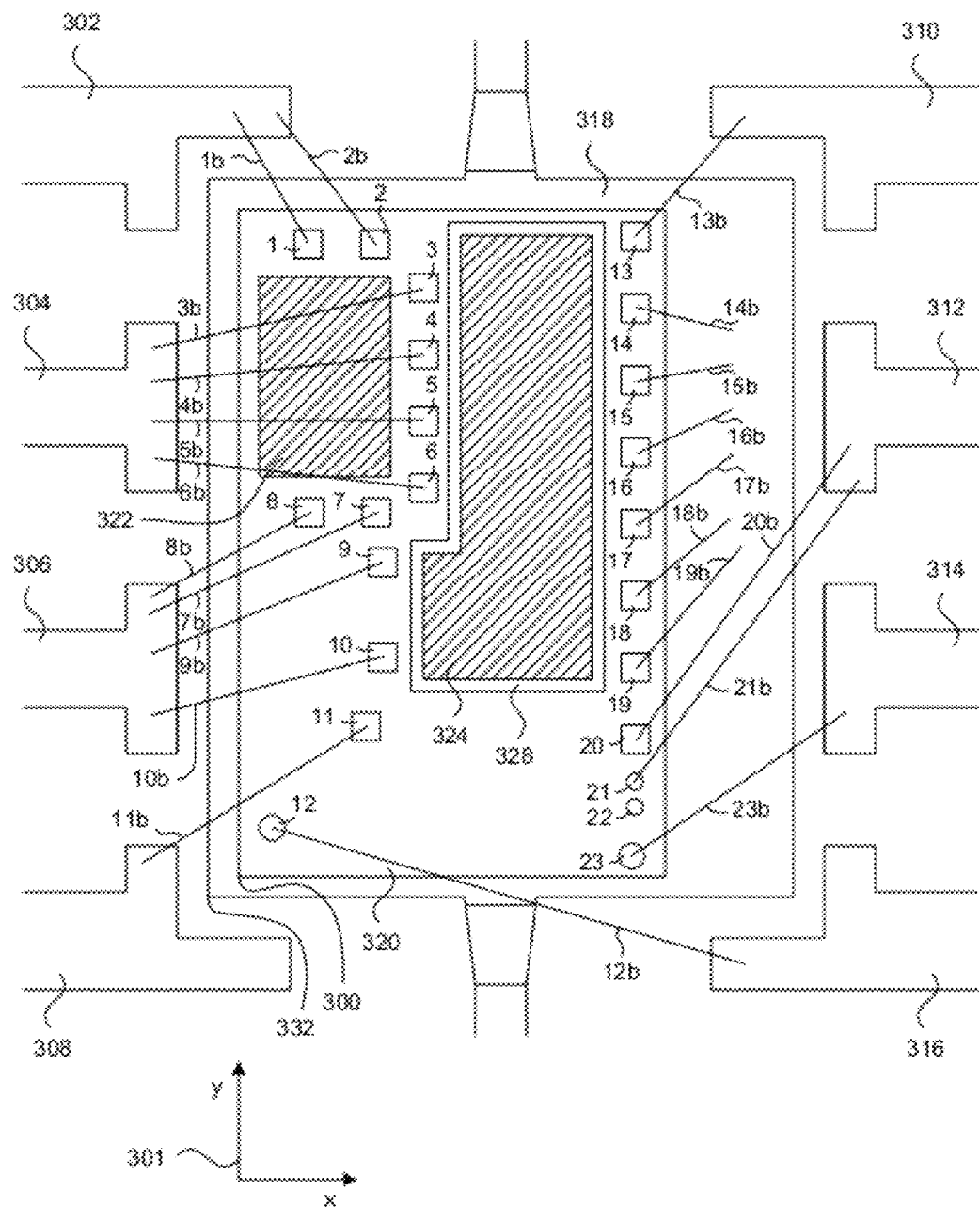
FIG. 3 is a plan view of a die on a package substrate illustrating connections to the package leads according to an embodiment.

FIG. 3 is a plan view illustrating die 320 situated on a package substrate according to an embodiment. Shown in FIG. 3 are die pads labeled 1 through 23. In the particular embodiment illustrated in FIG. 3, pad 22 provides a signal to indicate whether the power provided is sufficient, and for some applications this pad is not used. It's illustration in FIG. 3 shows that some embodiments may have one or more die pads that are not used in a particular application, and therefore may not be connected to any of the package leads. Shown are package leads 302, 304, 306, 308, 310, 312, 314, 316, and 318. Package lead 318 is relatively large (its area is a significant portion of the package footprint) and is on the bottom of the package. It serves as a power ground, and may be termed a die attach pad. It also helps conduct heat away from die 320.

FIG. 3 does not show the package encapsulation that would cover die 320 and parts of the package leads. The package for the embodiment of FIG. 3 may be an eight lead small outline integrated circuit package (SOIC), such as for example what is commonly referred to as an SOIC8E exposed pad package.

In referring to the embodiment of FIG. 3, it is convenient to take the lower left corner of die 320, labeled 300, as the origin of a coordinate system in which the orientation is represented by the x-y coordinate system 301. Power MOSFET 322 is the high-side switch and power MOSFET 324 is the low-side switch. As is well known, power MOSFETs 322 and 324 each comprise a large number of MOSFETs in parallel. Surrounding MOSFET 324 is moat 328. The perimeters of the power MOSFETs, as well as the moat, are in general straight lines that are parallel to either the x-axis or the y-axis.

Figure 4:
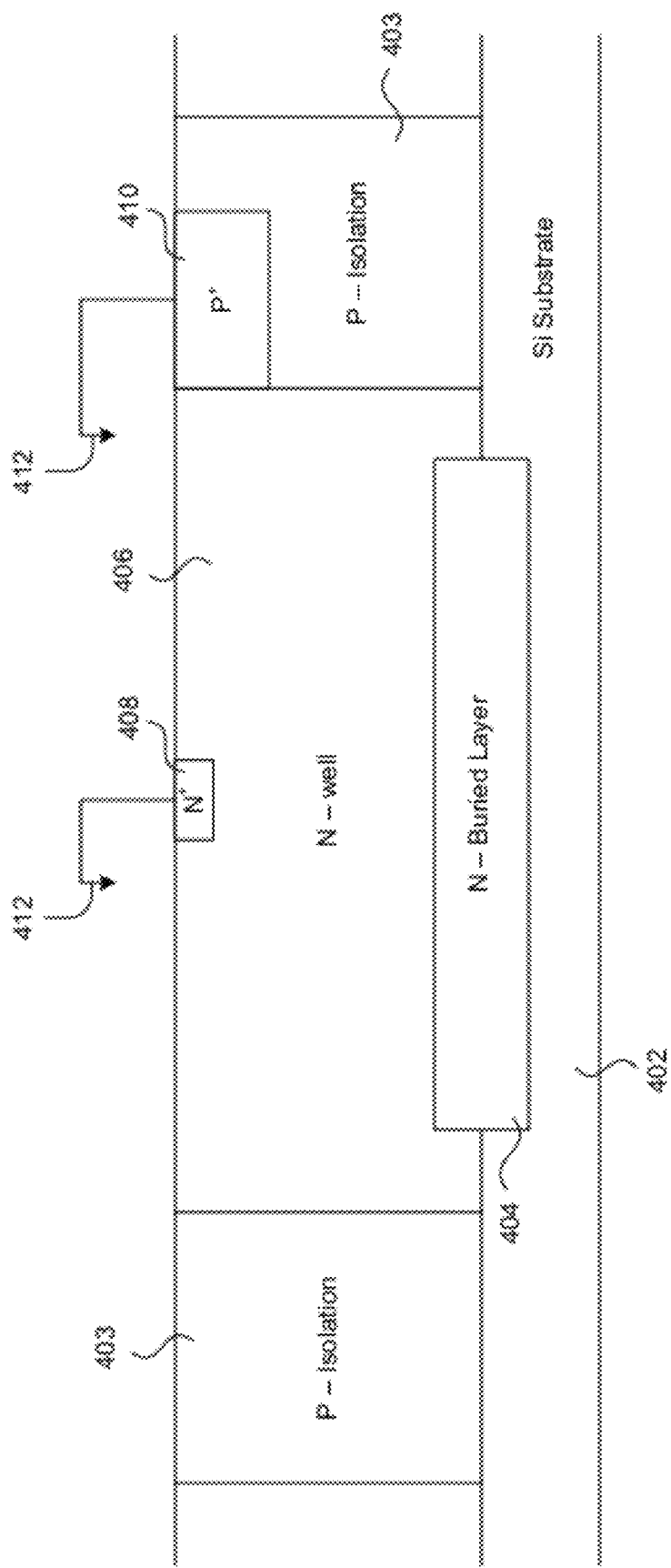
FIG. 4 is a cross-sectional view of a prior art moat.

An example of a moat structure is illustrated in FIG. 4, representing a simplified cross-sectional view of a moat in which the slice is taken perpendicular to the long dimension of the moat. That is, if for example a moat runs along the x-axis, the view represented by FIG. 4 is a slice taken perpendicular to the x-y plane and parallel to the y-axis, where the left hand side of FIG. 4 is closest to MOSFET 324. The structure illustrated in FIG. 4 may be repeated along a long dimension of a moat. Silicon substrate 402 comprises p doped isolation regions 403, n doped buried layer 404, n doped well 406, highly doped n region 408, and highly doped p region 410, where regions 408 and 410 are connected to ground 412 to remove (or substantially remove) any injected substrate current.

Pads 1 and 2 are each connected by bond wires 1b and 2b, respectively, to package lead 302, where package lead 302 is connected to the supply voltage $V_{IN}$. The center of pad 1 has coordinates (158.3 μm, 2945.8 μm), and the center of pad 2 has coordinates (398.8 μm, 2959.4 μm). Pads 3, 4, 5, and 6 are switch point pads (e.g., switch point 114), with each connected by bond wires 3b, 4b, 5b, and 6b, respectively, to package lead 304. These pads have, respectively, coordinates (599.2 μm, 2810.2 μm), (599.2 μm, 2465.1 μm), (599.2 μm, 2133.8 μm), and (599.2 μm, 1791.5 μm). Pads 7, 8, 9, and 10 are also switch point pads, with each connected by bond wires 7b, 8b, 9b, and 10b, respectively, to package lead 306. These pads have, respectively, coordinates (379.5 μm, 1716.2 μm), (179.8 μm, 1716.2 μm), (417.2 μm, 1439.3 μm), and (417.2 μm, 1083.2 μm).

Pad 11 is connected by bond wire 11b to package lead 308, which serves as a bootstrap lead. For example, for some embodiments, there may be a capacitor connected between a switch point and the bootstrap pad to form a floating supply across a driver for high-side MOSFET 322. Pad 11 has coordinates (353.8 μmm, 883.4 μm). Pad 12 is connected by bond wire 12b to package lead 316, which may serve as a dual-function lead to enable or synchronize the DC to DC power converter circuit. For example, for some embodiments, an external clock may be applied to package lead 316 to change the switching frequency, or as another example, package lead 316 may be connected to supply voltage $V_{IN}$ by way of a 100KΩ resistor for an automatic start-up feature. Pad 12 has coordinates (96.5 μm, 229.8 μm).

Pad 13 is connected by bond wire 13b to a package lead 310. Package lead 310 is an analog ground lead. Pads 14, 15, 16, 17, 18, and 19 are each connected, respectively, by bond wires 14b, 15b, 16b, 17b, 18b, and 19b to package lead 318. Pads 13 through 19 have, respectively, coordinates (1493.4 μm, 2984.2 μm), (1466.3 μm, 2815.1 μm), (1466.3 μm, 2469 μm), (1466.3 μm, 2121.9 μm), (1466.3 μm, 1774.8 μm), (1466.4 μm, 1427.7 μm), and (1466.4 μm, 1080.6 μm).

Pads 20 and 21 are connected, respectively, by bond wires 20b and 21b to package lead 312. Package lead 312 is connected to a bias supply voltage $V_{CC}$. Pads 20 and 21 have coordinates, respectively, (1456.7 μm, 757.6 μm) and (1477.8 μm, 595.7 μm).

Pad 23 is connected to package lead 314, which is at the feedback voltage (e.g., the voltage at node 103). Pad 23 has coordinates (1473.5 μm, 95.3 μm). For some embodiments, the feedback voltage may be generated by an external resistor divider from the output voltage to ground, where a tap to the external resistor divider is provided to package lead 314.

For ease of illustration, not shown are the electrical connections from pads 1 and 2 to high-side MOSFET 322, switch point pads 3 through 10 to high-side MOSFET 322 and low-side MOSFET 324, and power ground pads 14 through 19 to low-side MOSFET 324.

The corners of high-side MOSFET 322 are at coordinates (33.0 μm, 3022.2 μm), (525.3 μm, 2894.3 μm), (525.3 μm, 1767.1 μm), and (33.0 μm, 1767.1 μm). The corners of low-side MOSFET 324 are at coordinates (661.6 μm, 3040.9 μm), (1407.9 μm, 3040.9 μm), (1407.9 μm, 976.3 μm), (479.5 μm, 976.3 μm), (479.5 μm, 1545.3 μm), and (661.6 μm, 1545.3 μm).

For some embodiments, a pad has a height and width of 110.0 μm, and a moat may have a width of 24 μm. For some embodiments, a die without scribelines may have a width of 1570 μm and a height of 3070 μm. For some embodiments, the offset between corners 300 and 332 may be in the neighborhood of ±20 mils. For some embodiments, the bondwires may have a diameter of about 1.5 mils.

For the particular embodiment of FIG. 3, MOSFET 324 is separated into three regions, where each region comprises a large number of MOSFETs connected in parallel. The sources and drains of the regions are connected in parallel, but the gates of each region are driven by separate drivers. As an example, a first region of MOSFETs has corners (479.5 μm, 1545.3 μm), (1407.9 μm, 1545.3 μm), (1407.9 μm, 976.3 μm), and (479.5 μm, 976.3 μm); a second region of MOSFETs has corners (525.3 μm, 1767.1 μm); (1407.9 μm, 1767.1 μm), (1407.9 μm, 1557.1 μm), and (661.6 μm, 1557.1 μm); and a third region of MOSFETs has corners (661.6 μm, 3040.9 μm); (1407.9 μm, 3040.9 μm), (1407.9 μm, 1778.9 μm), and (661.6 μm, 1778.9 μm).

In practice, not all embodiments will have the pad and corner coordinates as described with respect to the embodiment of FIG. 3. For example, the x and y coordinates for a pad or corner may be within 320 μm of the values given above. However, this must be interpreted appropriately, for obviously a pad cannot be too close to a MOSFET, nor can it be up to the edge of the die. The offset between reference corner 300 for die 320 and package corner 332 may also vary from the value given above.

Various modifications may be made to the described embodiments without departing from the scope of the invention as claimed below.

I claim:

1. A die, the die having a die corner, the die comprising:
   a high-side power MOSFET having a drain and a source;
   a first die pad and a second die pad, each connected to the drain of the high-side power MOSFET, the first die pad having with respect to the die corner coordinates (158.3 μm±d, 2945.8 μm±d), and the second die pad having with respect to the corner coordinates (398.8 μm±d, 2959.4 μm±d), where d is not greater than 320.0 μm;
   a low-side power MOSFET having a drain and a source;
   a third die pad, a fourth die pad, a fifth die pad, and a sixth die pad, each connected to the source of the high-side power MOSFET and to the drain of the low-side power MOSFET, the third, fourth, fifth, and sixth die pads having with respect to the die corner, respectively, coordinates (599.2 μm±d, 2810.2 μm±d), (599.2 μm±d, 2465.1 μm±d), (599.2 μm±d, 2133.8 μm±d), and (599.2 μm±d, 1791.5 μm±d);

a seventh die pad, an eighth die pad, a ninth die pad, and a tenth die pad, each connected to the source of the high-side power MOSFET and to the drain of the low-side power MOSFET, the seventh, eighth, ninth, and tenth die pads having with respect to the die corner, respectively, coordinates (379.5 μm±d, 1716.2 μm±d), (179.8 μm±d, 1716.2 μm±d), (417.2 μm±d, 1439.3 μm±d), and (417.2 μm±d, 1083.2 μm±d); and a fourteenth die pad, a fifteenth die pad, a sixteenth die pad, a seventeenth die pad, an eighteenth die pad, and a nineteenth die pad, each connected to the drain of the low-side power MOSFET, the fourteenth, fifteenth, sixteenth, seventeenth, eighteenth, and nineteenth die pads having with respect to the die corner, respectively, coordinates (1466.3 μm±d, 2815.1 μm±d), (1466.3 μm±d, 2469 μm±d), and (1466.3 μm±d, 2121.9 μm±d), (1466.3 μm±d, 1774.8 μm±d), (1466.4 μm±d, 1427.7 μm±d), and (1466.4 μm±d, 1080.6 μm±d), wherein the high-side MOSFET has a first corner, a second corner, a third corner, and a fourth corner, having with respect to the die corner, respectively, coordinates (33.0 μm±d, 3022.2 μm±d), (525.3 μm±d, 2894.3 μm±d), (525.3 μm±d, 1767.1 μm±d), and (33.0 μm±d, 1767.1 μm±d), wherein the low-side MOSFET has a first corner, a second corner, a third corner, a fourth corner, a fifth corner, and a sixth corner, having with respect to the die corner, respectively, coordinates (661.6 μm±d, 3040.9 μm±d), (1407.9 μm±d, 3040.9 μm±d), (1407.9 μm±d, 976.3 μm±d), (479.5 μm±d, 976.3 μm±d), (479.5 μm±d, 1545.3 μm±d), and (661.6 μm±d, 1545.3 μm±d), wherein the coordinate of each die pad is corresponds to a geometric center of the die pad, and wherein each die pad is fully within the die and is not in contact with the edge of the die.

2. The die as set forth in claim 1, wherein d is not greater than 160 μm.

3. The die as set forth in claim 1, wherein d is not greater than 80 μm.

4. The die as set forth in claim 1, wherein the low-side MOSFET comprises a first region of MOSFETs, a second region of MOSFETs, and a third region of MOSFETs.

5. The die as set forth in claim 4, wherein the first region of MOSFETs has corners with respect to the die corner at coordinates (479.5 μm±d, 1545.3 μm±d), (1407.9 μm±d, 1545.3 μm±d), (1407.9 μm±d, 976.3 μm±d), and (479.5 μm±d, 976.3 μm±d); the second region of MOSFETs has corners with respect to the die corner at coordinates (525.3 μm±d, 1767.1 μm±d); (1407.9 μm±d, 1767.1 μm±d), (1407.9 μm±d, 1557.1 μm±d), and (661.6 μm±d, 1557.1 μm±d); and the third region of MOSFETs has corners with respect to the die corner at coordinates (661.6 μm±d, 3040.9 μm±d); (1407.9 μm±d, 3040.9 μm±d), (1407.9 μm±d, 1778.9 μm±d), and (661.6 μm±d, 1778.9 μm±d).

6. The die as set forth in claim 5, wherein d is not greater than 160 μm.

7. The die as set forth in claim 5, wherein d is not greater than 80 μm.

8. A packaged integrated circuit comprising:
a die, the die having a die corner, the die comprising:
a high-side power MOSFET having a drain and a source;
a first die pad and a second die pad, each connected to the drain of the high-side power MOSFET, the first die pad having with respect to the die corner coordinates (158.3 μm±d, 2945.8 μm±d), and the second die pad having with respect to the corner coordinates (398.8 μm±d, 2959.4 μm±d), where d is not greater than 320.0 μm;
a low-side power MOSFET having a drain and a source;
a third die pad, a fourth die pad, a fifth die pad, and a sixth die pad, each connected to the source of the high-side power MOSFET and to the drain of the low-side power MOSFET, the third, fourth, fifth, and sixth die pads having with respect to the die corner, respectively, coordinates (599.2 μm±d, 2810.2 μm±d), (599.2 μm±d, 2465.1 μm±d), (599.2 μm±d, 2133.8 μm±d), and (599.2 μm±d, 1791.5 μm±d);
a seventh die pad, an eighth die pad, a ninth die pad, and a tenth die pad, each connected to the source of the high-side power MOSFET and to the drain of the low-side power MOSFET, the seventh, eighth, ninth, and tenth die pads having with respect to the die corner, respectively, coordinates (379.5 μm±d, 1716.2 μm±d), (179.8 μm±d, 1716.2 μm±d), (417.2 μm±d, 1439.3 μm±d), and (417.2 μm±d, 1083.2 μm±d); and
a thirteenth die pad, a fourteenth die pad, a fifteenth die pad, a sixteenth die pad, a seventeenth die pad, an eighteenth die pad, and a nineteenth die pad; wherein the fourteenth die pad, the fifteenth die pad, the sixteenth die pad, the seventeenth die pad, the eighteenth die pad, and the nineteenth die pad are each connected to the drain of the low-side power MOSFET; the thirteenth, fourteenth, fifteenth, sixteenth, seventeenth, eighteenth, and nineteenth die pads having with respect to the die corner, respectively, coordinates (1493.4 μm±d, 2984.2 μm±d), (1466.3 μm±d, 2815.1 μm±d), (1466.3 μm±d, 2469 μm±d), and (1466.3 μm±d, 2121.9 μm±d), (1466.3 μm±d, 1774.8 μm±d), (1466.4 μm±d, 1427.7 μm±d), and (1466.4 μm±d, 1080.6 μm±d); and
a package substrate comprising:
a first lead connected to the first and second die pads,
a second lead connected to the third, fourth, fifth, and sixth die pads;
a third lead connected to the seventh, eighth, ninth, and tenth die pads;
a fourth lead connected to the thirteenth die pad; and
a die attach pad connected to the fourteenth, fifteenth, sixteenth, seventeenth, eighteenth, and nineteenth die pads,
wherein the high-side MOSFET has a first corner, a second corner, a third corner, and a fourth corner, having with respect to the die corner, respectively, coordinates (33.0 μm±d, 3022.2 μm±d), (525.3 μm±d, 2894.3 μm±d), (525.3 μm±d, 1767.1 μm±d), and (33.0 μm±d, 1767.1 μm±d);
wherein the low-side MOSFET has a first corner, a second corner, a third corner, a fourth corner, a fifth corner, and a sixth corner, having with respect to the die corner, respectively, coordinates (661.6 μm±d, 3040.9 μm±d), (1407.9 μm±d, 3040.9 μm±d), (1407.9 μm±d, 976.3 μm±d), (479.5 μm±d, 976.3 μm±d), (479.5 μm±d, 1545.3 μm±d), and (661.6 μm±d, 1545.3 μm±d);
wherein the coordinate of each die pad is corresponds to a geometric center of the die pad, and wherein each die pad is fully within the die and is not in contact with the edge of the die.

9. The packaged integrated circuit as set forth in claim 8, wherein d is not greater than 160 μm.

10. The packaged integrated circuit as set forth in claim 8, wherein d is not greater than 80 μm.

11. The die as set forth in claim 8, wherein the low-side MOSFET comprises a first region of MOSFETS, a second region of MOSFETs, and a third region of MOSFETs.

12. The die as set forth in claim 11, wherein the first region of MOSFETs has corners with respect to the die corner at coordinates (479.5 μm±d, 1545.3 μm±d), (1407.9 μm±d, 1545.3 μm±d), (1407.9 μm±d, 976.3 μm±d), and (479.5 μm±d, 976.3 μm±d); the second region of MOSFETs has corners with respect to the die corner at coordinates (525.3 μm±d, 1767.1 μm±d); (1407.9 μm±d, 1767.1 μm±d), (1407.9 μm±d, 1557.1 μm±d), and (661.6 μm±d, 1557.1 μm±d); and the third region of MOSFETs has corners with respect to the die corner at coordinates (661.6 μm±d, 3040.9 μm±d); (1407.9 μm±d, 3040.9 μm±d), (1407.9 μm±d, 1778.9 μm±d), and (661.6 μm±d, 1778.9 μm±d).

13. The packaged integrated circuit as set forth in claim 12, wherein d is not greater than 160 μm.

14. The packaged integrated circuit as set forth in claim 12, wherein d is not greater than 80 μm.

* * * * *